United States Patent
Zhou et al.

(10) Patent No.: US 8,065,374 B2
(45) Date of Patent: Nov. 22, 2011

(54) APPLICATION-LEVEL LOSSLESS COMPRESSION

(75) Inventors: Qinggang Zhou, Marietta, GA (US); David Granfors, Alpharetta, GA (US)

(73) Assignee: AT&T Intellectual Property I, LP, Atlanta, GA (US)

( * ) Notice: Subject to any disclaimer, the term of this patent is extended or adjusted under 35 U.S.C. 154(b) by 303 days.

(21) Appl. No.: 12/259,628

(22) Filed: Oct. 28, 2008

(65) Prior Publication Data
US 2010/0106858 A1   Apr. 29, 2010

(51) Int. Cl.
*G06F 15/16* (2006.01)
(52) U.S. Cl. .......................... 709/206; 709/247
(58) Field of Classification Search .................. 709/227, 709/228, 206, 230, 247, 231
See application file for complete search history.

(56) References Cited

U.S. PATENT DOCUMENTS

| 2003/0028606 A1* | 2/2003 | Koopmans et al. ........... 709/206 |
| 2005/0004972 A1* | 1/2005 | Meskauskas .................. 709/200 |
| 2008/0204283 A1* | 8/2008 | Krimerman et al. ............ 341/60 |

* cited by examiner

*Primary Examiner* — Frantz Jean
(74) *Attorney, Agent, or Firm* — Turocy & Watson, LLP

(57) ABSTRACT

The claimed subject matter relates to an architecture that can provide substantially lossless compression and subsequent decompression of messages at an application level. In particular, the architecture, in one aspect thereof, can receive a set of messages. When application data for received messages does not match stored message, the message can be stored to a buffer. In contrast, if application data matches that for a stored message, the received message can be discarded and a message count incremented. The compressed message pattern can include the stored message and the message count. Upon decompression, the number of messages received can be identified by the message count and the application data can be readily recreated for all messages by copying that data. Non-application data, such as time stamp information can be reconstructed based upon a buffer period, other timing offset data, or other data fields included in the message pattern.

20 Claims, 11 Drawing Sheets

APPLICATION-LEVEL LOSSLESS COMPRESSION

CROSS-REFERENCE TO RELATED APPLICATIONS

This application is related to co-pending U.S. patent application Ser. No. 12/265,482 filed on Nov. 5, 2008, entitled, "AGGREGATE CONTROL FOR APPLICATION-LEVEL COMPRESSION." The entirety of this application is incorporated herein by reference.

TECHNICAL FIELD

The present application relates generally to information compression techniques in a computer network, and more specifically to compressing and decompression of application instances such as periodic network messages.

BACKGROUND

In conventional systems, data compression or source coding is the process of encoding information using fewer bits than an uncompressed representation would use through use of specific encoding schemes. Compression is useful because it helps reduce the consumption of expensive resources, such as storage space or transmission bandwidth. On the downside, compressed data must be decompressed to be used, and this extra processing may be detrimental to some applications. This difficulty is especially true given that most compression or encoding algorithms today compress data at the bit level.

For example, conventional lossless compression algorithms seek to leverage statistical redundancies extant in the bit representations (e.g., 1's and 0's) that compose various types of data. Lossless compression schemes are reversible so that the original data can be reconstructed exactly as it existed prior to encoding. An example of lossless compression is ZIP file format, which is often employed for compressing documents or other data entities or data formats that require accurate recreation at the bit level. On the other hand, lossy encoding can provide greater compression ratios at the expense of some data loss. Generally, lossy compression is employed in connection with images, audio, or video files, sacrificing some degree of fidelity to attain a higher level of compression. Examples of lossy compression are MP3, MPEG, JPG formats. Both forms of compression have relatively rigid maximum compression ratios.

In the domain of computer network systems, bit-level compression of data can reduce bandwidth utilization, which can lessen the payload of traffic through potential resource bottlenecks. The trade-off is an increase in the required computational power to perform the compression/decompression algorithms, which commensurately increases the costs associated with various network equipment. In many instances, the cost-benefit analysis of this increased expense is not justified, especially when the occurrence of a resource bottleneck is a relatively low-probability event. For example, consider a network monitoring system (NMS) that tracks alarm messages from a network or a particular portion of a network.

Typically, the NMS will received alarm messages from network equipment (e.g., access multiplexers) when a fault condition arises with or is detected by the equipment. These fault conditions are often isolated events, and do not overly burden the NMS. However, in certain situations, "alarm storms" can arise. Alarm storms typically occur when many alarm messages are generated in a relatively short period of time, often due to a common or related set of events, e.g. due to malicious denial of service attacks or even due to natural forces such as weather. During alarm storms or other times of high alarm message input to a gateway of a NMS, the NMS is conventionally forced to shut down or discard much information that could be helpful to an upstream analysis system that might receive alarms from multiple NMS's to determine the nature of the problem. Accordingly, it would be beneficial to employ compression techniques to lessen the strain on the NMS during such times, yet bit-level compression techniques, with their limited compression ratios and higher additional costs do not appear adequate to address these or other suitable situations.

SUMMARY

The following presents a simplified summary of the claimed subject matter in order to provide a basic understanding of some aspects of the claimed subject matter. This summary is not an extensive overview of the claimed subject matter. It is intended to neither identify key or critical elements of the claimed subject matter nor delineate the scope of the claimed subject matter. Its sole purpose is to present some concepts of the claimed subject matter in a simplified form as a prelude to the more detailed description that is presented later.

The subject matter disclosed and claimed herein, in one aspect thereof, comprises an architecture that can facilitate substantially lossless compression of messages at an application level. Thus, while conventional compression schemes operate on bit level representations of data, the architecture can function on an entirely different data level, e.g. the application level, by compressing application instances such as messages. In accordance therewith and to other related ends, the architecture can receive a message that includes application data (e.g., certain application-specific data fields) and non-application data (e.g., time stamp information or the like).

The architecture can compress substantially any number of related incoming messages into a message pattern that, often, is approximately the same size as a single message. Hence, any given intermediary system that is subject to potential resource utilization bottlenecks, including but not limited to a network monitoring system (NMS), can implements the compression features at one edge of the potential bottleneck, and the decompression features at the other edge. Thus, bandwidth or other network resources can remain within acceptable levels even during periods of high usage, such as during alarm storms for instance. Moreover, because the compression employed is at the application level, actual traffic (e.g., the number of messages) can be reduced through the potential bottleneck. In contrast, bit-level compression would likely result in merely a reduction in the bit payload of each message rather than in the number of messages, is limited in compression ratio, and is likely more costly in terms necessary processing power.

The application-level compression can be accomplished by comparing the application data of received message to that for stored messages. If no match is found, then the received message can be stored to a buffer and a buffer timer can be started which will expire after a buffer period. On the other hand, if a match is found, then the received message includes identical application data as that for the stored message. Accordingly, a message count associated with the stored message can be incremented by 1, and the received message discarded. Upon expiration of the buffer period, the corresponding stored message along with the associated message count can be packaged into the message pattern and forwarded along.

At the decompression side, the architecture can received the message pattern, extract the stored message to create an original message. The original message can be copied to produce a number of duplicate messages based upon the message count. Since application data for the original message and all duplicates will be identical, only the non-application (e.g., time stamp information) data need be reconstituted. This can be achieved by adding a timing offset to the time stamp of the original message in a cumulative manner. The timing offset can be determined as a function of the message count and the buffer period, or in some other suitable manner.

The following description and the annexed drawings set forth in detail certain illustrative aspects of the claimed subject matter. These aspects are indicative, however, of but a few of the various ways in which the principles of the claimed subject matter may be employed and the claimed subject matter is intended to include all such aspects and their equivalents. Other advantages and distinguishing features of the claimed subject matter will become apparent from the following detailed description of the claimed subject matter when considered in conjunction with the drawings.

DETAILED DESCRIPTION

Figure 1:
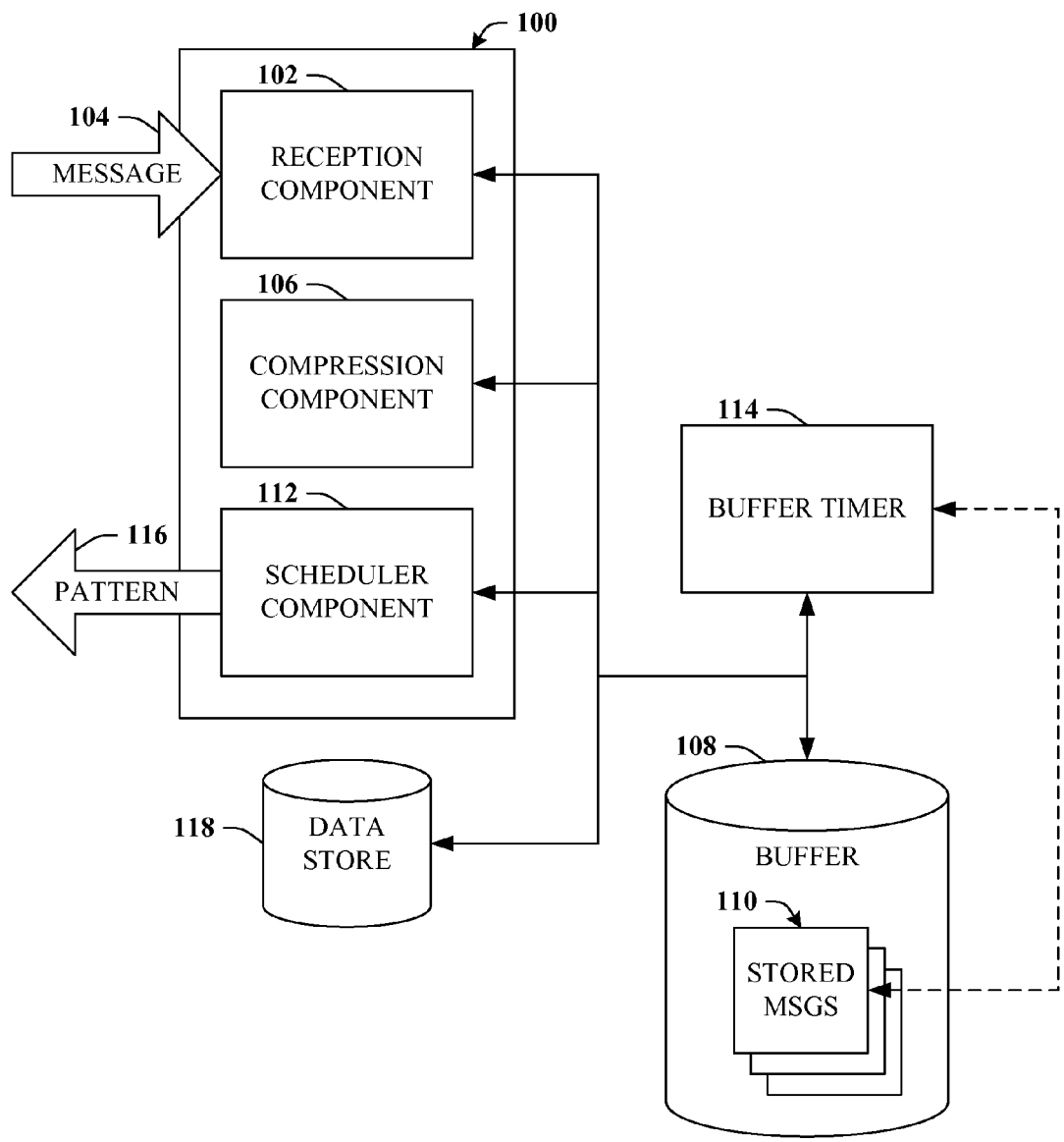
FIG. 1 is a block diagram of a system that can provide substantially lossless compression of messages at an application level.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

As used in this application, the terms "component," "module," "system", or the like can refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g. card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As used herein, the terms to "infer" or "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Referring now to the drawing, with reference initially to FIG. 1, system 100 that can provide substantially lossless compression of messages at an application level is depicted. In particular, rather than implementing bit-level compression algorithms or encoding to reduce the number of bits necessary for representing data, system 100 is directed toward reducing the number of application instances (e.g., messages), with little or no loss of application level data upon decompression. In accordance therewith, the claimed subject matter can, e.g., mitigate resource bottlenecks by compressing certain information at the application level before passing through potential resource bottlenecks.

In general, system 100 can include reception component 102 that can receive message 104. Message 104 can include a wide variety of information, but will typically include at least application data and a time stamp, both of which are further discussed in connection with FIG. 2. In an aspect of the claimed subject matter, message 104 can be a network monitoring system (NMS) alarm message that can, e.g. indicate a failure or malfunction condition for a network resource. Thus, to provide concrete illustrations, message 104 is generally described herein in the context of an NMS alarm message, however, it should be appreciated and understood that message 104 can relate to other applications as well.

Figure 2:
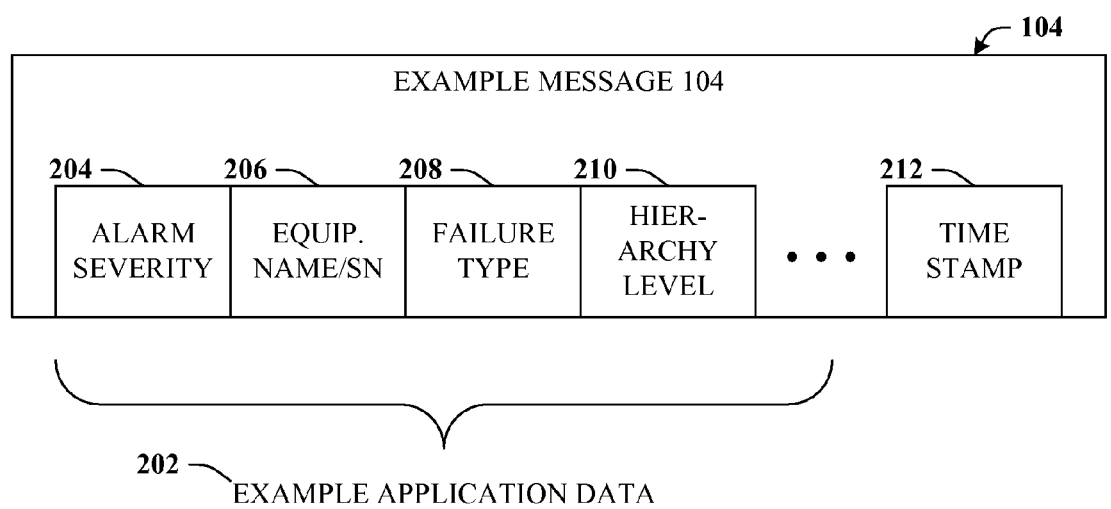
FIG. 2 depicts a block diagram of exemplary message 104 is illustrated as a NMS alarm message.

While still referring to FIG. 1, but turning also to FIG. 2, exemplary message 104 is illustrated as a NMS alarm message. As indicated supra, message 104 can include application data that can relate to a particular context or application, an example of which is provided at reference numeral 202. In this case, in the context of a NMS alarm message, application data 202 of message 104 can include a number of data fields relating to network monitoring. For example, application data 202 can include alarm severity 204 that can indicate, e.g., a predefined level of importance for the NMS alarm message 104. A name or serial number of the equipment or device that is subject to a failure condition and/or is reporting the failure condition can also be included in NMS message 104 as denoted by reference numeral 206. Additionally, failure type 208 (e.g., failed hardware, a cut line, a loss of signal . . . ) can also be included in alarm message 104. Hierarchy level 210 of the reporting device or equipment can be included in NMS message 104 as well, which is further detailed infra. Naturally, other suitable fields, although not expressly depicted, can exist as application data 202.

In addition to example application data 202, message 104 can also include time stamp 212. Time stamp 212 will typically include a time value representing a date and time when message 104 is generated or transmitted by the disparate equipment or device. However, in some cases, time stamp 212 can be a time in which message 104 is received by reception component 102. Appreciably, other fields can exist apart from time stamp 212 and those included in application data 202, which is detailed further herein.

Continuing the description of FIG. 1, system 100 can also include compression component 106 that can examine stored messages 110 included in buffer 108. For instance, compression component 106 can compare application data 202 from message 104 to corresponding application data contained in stored messages 110. When compression component 106 does not find matching application data 202 among stored data 110, then compression component 106 can store message 104 to buffer 108 as stored message 110. On the other hand, when compression component 106 finds matching application data 202 among stored messages 110, then it can be assumed that message 104 is a duplicate message of a previously received message 104. For example, based upon the previously introduced scenario in which message 104 is a NMS alarm message, when resources fail in a network, it is common for equipment related to the failure to transmit NMS alarm messages at discrete intervals, e.g., an alarm every 30 seconds or the like. Thus, the first NMS alarm message will generally be identical to a duplicate alarm message (e.g., one transmitted 30 seconds later) in terms of application data 202, differing only in the value of time stamp 212 or other non-application data fields (e.g. fields not used for matching purposes). Thus, by contrast, application data 202 can be thought of as those data fields that are identical among all messages 104 for a particular application.

Accordingly, when application data 202 matches that for a stored message 110, compression component 106 can increment a message count associated with the matching stored message 110 rather than saving the received message 104 to buffer 108. Later, for instance during a decompression stage, the message count can be indicative of the number of messages 104 that were received, all with substantially identical application data 202. Thus, all received messages 104 can be recreated based upon a single message 104 by, e.g., producing copies of application data 202. While other data fields, such as time stamp 212 (or other non-application data fields) are not identical for duplicate messages, in many cases, even this information can be accurately recreated as well, as further described herein.

Hence, when compression component 106 can detect matching application data 202 already included in buffer 108, the message count can be incremented and message 104 simply discarded. The described mechanism for compression at the application level can potentially reduce hundreds of application-based messages 104 into one or more data entity that is approximately the size of a single message 104, all with little or no loss of information, without employing slow and resource-intensive bit-level compression, and without the inherent upper bound on data compression ratios that limit bit-level compression efficiency. As an example case, messages 104 can be compressed before a potential network resource bottleneck, transferred through the potential bottleneck in compressed format, and then decompressed once beyond the potential bottleneck. For instance, referring again to the NMS, compression component 106 as well as other components included in system 100 can be implemented at a gateway that receives incoming messages from network equipment such as, e.g. access multiplexers.

These or other aspects can be quite beneficial to, e.g., a NMS during "alarm storms" that can overload the monitoring resources or in some cases shut down all processing altogether. Such alarm storms occur for a variety of reasons ranging from malicious denial of service attacks to resource failure due to adverse weather conditions or natural disasters; and conventionally result in a shutdown or malfunction in the NMS or, at a minimum, a loss of information to upstream network analysis systems that typically would utilize the lost information to accurately determine the nature of the failures or other network conditions or troubleshooting endeavors. Yet, by employing the claimed application level compression, certain vagaries associated with alarm storms or other resource bottlenecks can be mitigated.

Still referring to FIG. 1, system 100 can further include scheduler component 112 that can monitor buffer timer 114 and that can forward message pattern 116 upon expiration of a buffer period. Message pattern 116 can include, inter alia, stored message 110 and the message count for the stored message 110, wherein stored message 110 is a received message 104 that is stored to buffer 108. In addition, scheduler component 112 can initiate buffer timer 114 when compression component 106 stores message 104 to buffer 108 (as stored message 110). Thus, buffer timer 114 can begin timing at the point when a stored message 110 is input to buffer 108. Once buffer timer 114 counts for a period equal to the buffer period, then scheduler component 112 can remove stored message 110 from buffer 108, and forward message pattern 116 (which can include stored message 110). Appreciably, each stored message 110 can be associated with a unique buffer timer 114 or, in some cases, to a unique buffer 108 or portion of buffer 108.

As can be readily appreciated, any received message 104 with identical application data 202 to that of a stored message 110 can increment the message count for that stored message 110. Thus, the message count will typically accrue while stored message 110 remains in buffer 108, an amount of time defined by the buffer period. To provide a concrete illustration of the above, consider the following scenario.

Consider a NMS with the buffer period set to 5 minutes. Thus, incoming alarm messages 104 that are unique can be buffered as stored message 110 for 5 minutes. During the 5 minute buffer time, any repeated alarm messages 104 (e.g. messages with matching application data 202) can be discarded but with the message count associated with the stored message incremented by 1. If it is further assumed, as an example, that the network device transmitting the incoming alarm messages 104 does so at 30 second intervals, then upon expiration of the 5 minute buffer period, the message count for the described alarm will be incremented to 10 (e.g., 10 messages received from the device in the 5 minute buffer period). Appreciably, by dividing the buffer period by the message count, an interval for the alarm messages can be thus determined. For instance, based upon the above scenario, the 5 minute buffer timer divided by a message count of 10=30 second interval. By determining the interval, time stamp 212 information can be recreated based upon the time stamp 212 included in stored message 110, even though that information for 9 of the messages need not be explicitly included in message pattern 116. Accordingly, substantially all information included in those 10 messages 104, can be compressed into a single message pattern 116 that includes stored message 110 and the message count, and is therefore approximately the same size as only one message 104.

In an aspect of the disclosed subject matter, compression component 106 can append a count field to stored message 110, and can populate the count field with the message count for that stored message 110. Accordingly, message pattern 116 can be comprised of a single data entity rather than a combination of two or more data entities. This concept, as well as numerous additional concepts, is depicted with reference to FIG. 3.

Figure 3:
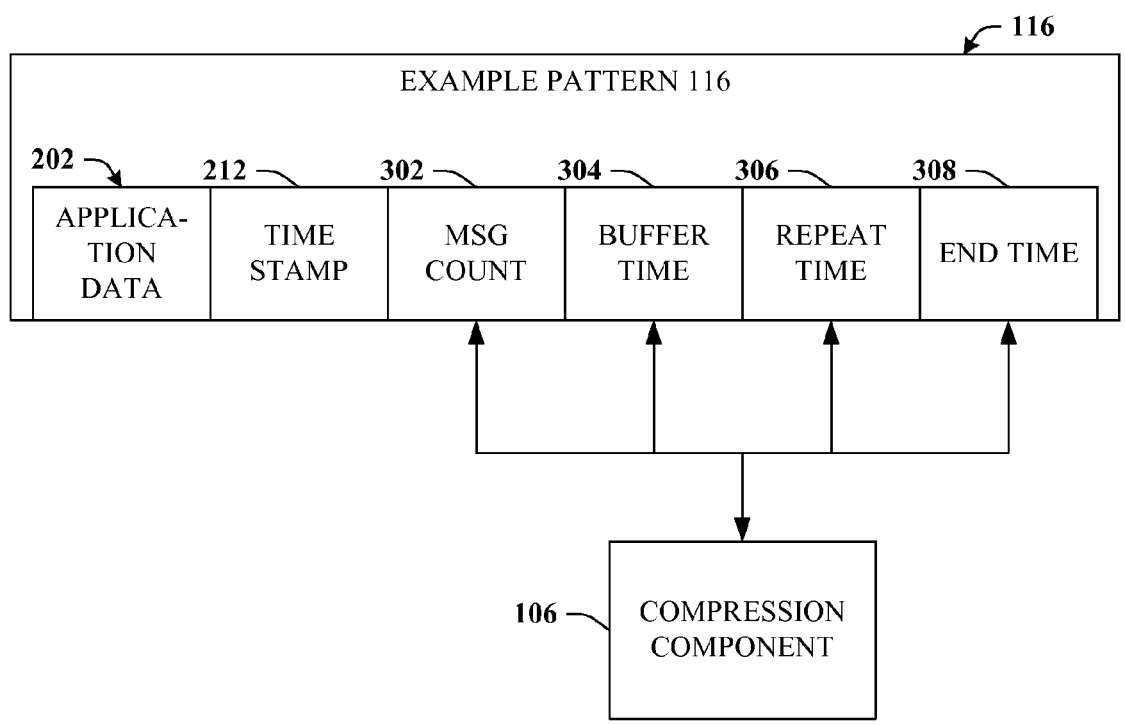
FIG. 3 provides a block diagram illustration of example pattern 116 that comprises a stored message, a message count, and various other optional fields.

Turning now to FIG. 3, example pattern 116 that comprises a stored message, a message count, and various other optional fields is illustrated. It should be understood that all or a portion of the fields detailed herein or otherwise suitable for inclusion can be included in stored message 110 as well. In such a case, compression component 106 can append the fields to stored message 110. Otherwise, these additional fields can be appended to a data structure denoted as pattern 116. Accordingly, as detailed supra, application data 202 and time stamp 212 that are included in stored message 110 can be included in pattern 116, as pattern 116 comprises stored message 110. Likewise, whether embedded in stored message 110 or kept distinct, message pattern 116 can also include message count 302, as discussed supra.

In addition, compression component 106 can append buffer time field 304 to stored message 110 (or message pattern 116), and can populate buffer time field 304 with the buffer period. Hence, the buffer period can be included in the information forwarded by scheduling component 112. However, it should be appreciated that the buffer period can be based upon a default time (e.g., 5 minutes or some other period), or acquired or set in some other manner. Thus, buffer time field 304 is generally an optional field and need not necessarily be expressly included in message pattern 116.

Furthermore, compression component 106 can append repeat time field 306 and can populate repeat time field 306 with a time value that represents a duplicate message interval determined by subtracting a stored time stamp 212 of stored message 110 included in buffer 108 from a time stamp 212 of a subsequently received message 104. In many situations, such as in the scenarios detailed supra, incoming messages 104 will be transmitted (e.g., from network equipment) at set intervals. By determining the interval based upon actual time stamps 212, it is therefore not necessary to determine this value by other means. Accordingly, example message pattern 116 need only include buffer time field 304 or repeat time filed 306, but not both.

Additionally or alternatively, compression component 106 can append end time field 308 to message pattern 116 or stored message 110. End time field 308 can be populated with a last message time stamp included in a last message. The last message can, e.g., represent a final duplicate message received prior to expiration of the buffer period. Hence, again returning to the previously introduced example in which 10 messages 104 are received within the 5 minute buffer period, a time stamp for each message 104 received can be input to end time field 308, with each new entry replacing the previous entry. Thus, upon input of the time stamp for the 10th or last message received, that final time value can be saved.

Generally, since buffer timer 114 begins when the first message is received, and since each message is transmitted at 30 second intervals, the 10th message 104 received will likely include a time stamp 212 that is 5 minutes later than the time stamp 212 for stored message 110. However, in the event that buffer timer 114 is not a multiple of the interval, or even when slight delays in the last message 104 might cause that message to arrive slightly later than expiration of the buffer period, calculating the interval based upon end time field 308 can be more accurate. Therefore, it should be appreciated that end time field 308 can be utilized instead of either buffer time field 304 or repeat time filed 306. It should also be appreciated that other aspects of lossless compression are also contemplated. For example, each time stamp 212 from duplicate messages can be included in message pattern 116 along with the message count. In such a case, message pattern 116 can be interpreted appropriately by examining the message count, with the number of recreated fields for each message being the total number of additional fields divided by the message count. Moreover, such a technique can allow the compression/decompression of substantially any type of non-application data 202 (e.g., types other than time stamp information), at the cost of slightly increasing the payload of message pattern 116.

Turning back to FIG. 1, it should be appreciated that system 100 can facilitate compression at an application-level of messages 104 in the manner described herein. In more specific contexts, such as when employed by NMS systems as discussed supra, system 100 can facilitate further compression. For example, given certain network hierarchy information, system 100 can be utilized to determine or infer likely messages 104 that will or should arise based upon examination of a particular message 104. In particular, compression component 106 can compare a NMS alarm message to a hierarchical network topology to identify a high-level resource failure. Such can be accomplished by examination of, e.g. hierarchy level 210 or by another means (e.g., by equipment name/SN 206).

Appreciably, when a particular resource fails, all dependent (e.g. lower level resources that depend upon the failed resource) will also like generate failure alarms. For instance, suppose a NMS alarm is received relating to a controller card that has failed. Accordingly, it can be determined or inferred that all ports or services that rely upon that card have or will also fail. Thus, compression component 106 can intelligently facilitate further application-level compression by generating a set of alarm messages for a lower hierarchical network resource that is dependent upon the high-level resource. These messages can be compressed in the same manner as those received, and can be employed to aid an upstream analysis system in determining the extent and nature of the fault. In addition, such features can forego the compression stage entirely and be employed at the decompression stage further enhance the efficiency.

To aid in these and other related endeavors, system 100 can further include or be operatively connected to data store 118. Data store 118 is intended to be a repository of all or portions of data, data sets, or information described herein or otherwise suitable for use with the claimed subject matter, and can include or be operatively coupled to buffer 108. Data store 118 can be centralized, either remotely or locally cached, or distributed, potentially across multiple devices and/or schemas. Furthermore, data store 118 can be embodied as substantially any type of memory, including but not limited to volatile or non-volatile, sequential access, structured access, or random access and so on. It should be understood that all or portions of data store 118 can be included in system 100, or can reside in part or entirely remotely from system 100.

Figure 4:
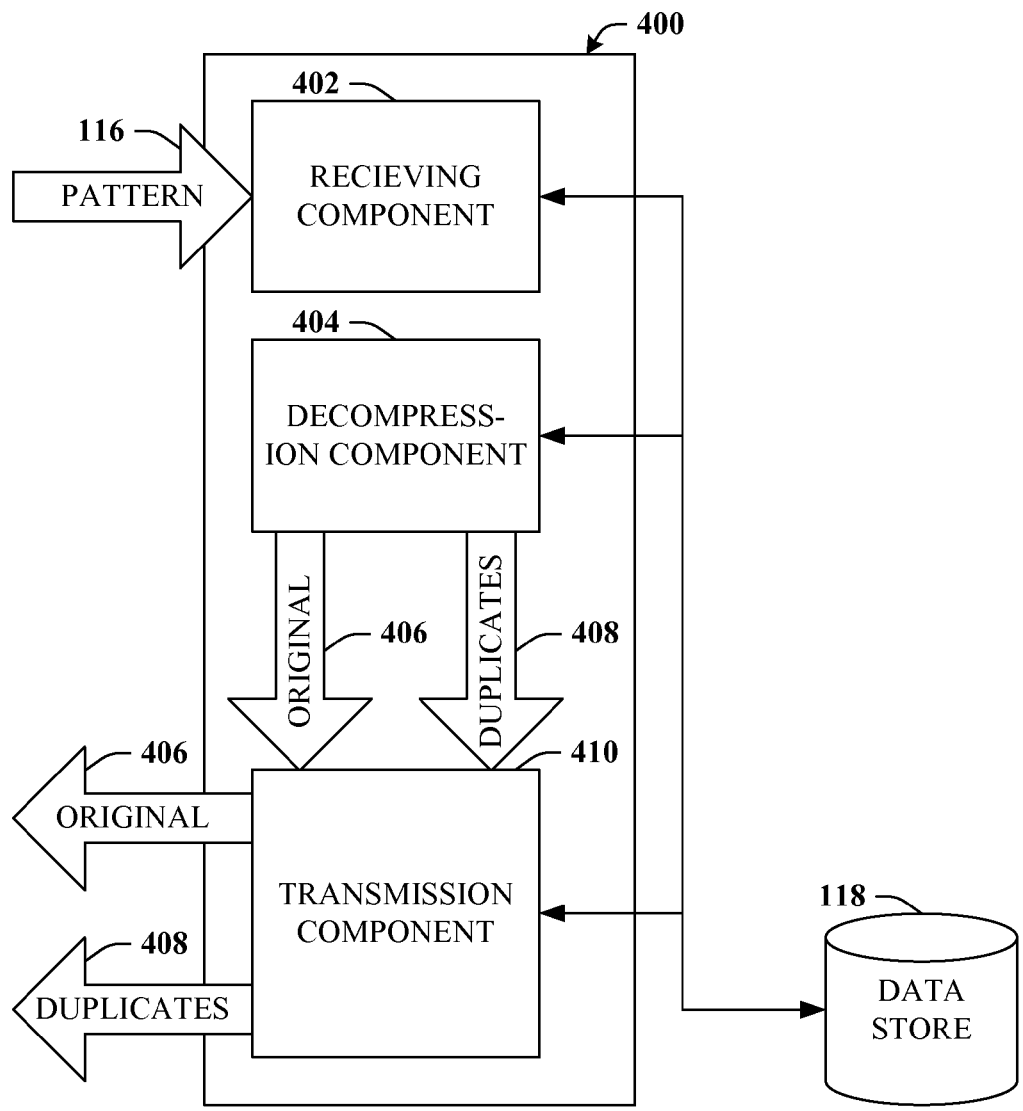
FIG. 4 is a block diagram of a system that can provide substantially lossless decompression of compressed messages at an application level.

Turning now to FIG. 4, system 400 that can provide substantially lossless decompression of compressed messages at an application level is depicted. In general, system 400 can include receiving component 402 that can receive message pattern 116. Message pattern 116 can include a message (e.g., message 104 or stored message 110) and the message count associated therewith, both as substantially described supra. Accordingly, the message portion of message pattern 116 can include application data 202 and time stamp 212, as discussed in connection with FIG. 2. Moreover, the message count can be embedded in the received message or in a disparate portion of message pattern 116. In addition, message pattern 116 can include various additional fields depending upon a particular implementation, as is depicted in connection with FIG. 3.

Furthermore, system 400 can also include data store 118 as well as decompression component 404 that can extract application data 202 and time stamp 212 from message pattern 116. These extracted elements can then be embedded into a separate data structure to produce original message 406. Thus, original message 406 can be substantially identical to an initial incoming message 104 that is stored to buffer 108 as stored message 110. In addition, decompression component 404 can produce a number of duplicate messages 408, wherein the number of duplicate messages 408 generated can be based upon the message count. For instance, if the message count is 10, then decompression component can produce the original message 406 and 9 duplicate messages 408. Each duplicate message 408 can be created by copying application data 202 of original message 406, since application data 202 is typically identical for a given message 104 that is matched by compression component 106 of FIG. 1.

Accordingly, each duplicate message 408 will differ only in non-application data, which in this case are the values of associated time stamps 212. It should be underscored yet again that other non-application data can exist, which can be recreated by various other means. However, in this case, in order to fully decompress message pattern 116, the time stamp information for each duplicate message 408 must be recreated. Such ends can be accomplished by decompression component 404 by populating a time stamp field for each duplicate message 408 with a value that can be derived by cumulatively adding a timing offset to the time stamp of original message 406.

Typically, the timing offset is intended to represent the interval in which messages 104 were received. Thus, if each related message 104 is received at 30 second intervals, then message pattern 116 will be encoded in a manner to allow decompression component 404 to translate or discover such information. In one aspect, decompression component 404 can determine the timing offset as a function of the buffer period detailed in connection with buffer 108 of FIG. 1. For example, given a buffer period of 5 minutes, a message count of 10 would indicate that the interval is 30 seconds. Thus, decompression component 404 can add 30 seconds to the time stamp of original message 406 and populate the time stamp field of the first duplicate message 408 with that value. 60 seconds (e.g., timing offset multiplied by 2) can be added to the time stamp of original message 406 to yield the time stamp for the second duplicate 408, and so on.

Appreciably, the buffer period can be a predefined value known to or discoverable by decompression component 404. Additionally or alternatively, the buffer period can be included in message pattern 116, such as in buffer time field 304. More generally, decompression component 404 can determine the timing offset as a function of the message count and a value included in one or more data fields of message pattern 116. The one or more data fields can include, e.g. buffer time field 304, as already mentioned; repeat time field 306, which relates to an interval measured by subtracting time stamp values from related incoming message 104; end time field 308, which relates to a difference between a first and last related message received during the buffer period; or by another suitable field or input.

Moreover, decompression component 404 can intelligently generating a set of alarm messages that do not rely upon processing at the compression stage. For example, decompression component 404 can be aware of various features of network topology. Thus, should a higher-level resource fail, then predictions or inferences relating to a lower hierarchical network resource that is dependent upon that higher-level resource can be made. Accordingly, decompression component create original and/or duplicate message 406, 408 by copying the time stamp information from messages originating from higher-level resources and fill in suitable application data based upon, e.g., a hierarchical network topology map. Such messages can be employed to aid an upstream analysis system in determining the extent and nature of the fault.

In an aspect of the disclosed subject matter, system 400 can also include transmission component 410 that can propagate original message 406 as well as all duplicate messages 408 to a disparate system. For example, returning once more to the NMS scenario, the subject matter disclosed herein can avoid potential bottlenecks associated with alarm storms or other resource-intensive events by compressing the alarm messages as discussed above, passing that compressed data pattern through the potential bottleneck, and then decompressing the pattern to yield substantially identical messages. Upon completion of the decompression, all messages can be forwarded, e.g. to an upstream analysis system that can utilize the information contained therein to address the situation. It should be appreciated, that transmission component 410 can transmit original message 406 first, then simulate the interval of the arriving messages 104 (e.g., every 30 seconds) by dispatching a duplicate message 408 every 30 seconds or the value of the interval otherwise determined or inferred.

It is readily understood that in such a case, the disparate system will receive each decompressed message as though directly from the source of the message (e.g., failing network hardware), but with an offset equal to the buffer period (e.g., 5 minutes). Alternatively, transmission component 410 can transmit original message 406 and all duplicate messages 408 substantially simultaneously. Given that the time stamp information relating to the message origin has been accurately recreated during decompression, it often will not matter when the disparate system receives the messages in terms of processing or analysis. In this latter case, it should be appreciated that the delay due to the buffer period can be effectively reduced, given that the last duplicate message 408 will include a time stamp very similar to the time in which the disparate system receives that message, with a difference limited substantially to the propagation delay between the two and the processing time to compress/decompress the messages.

Figure 5:
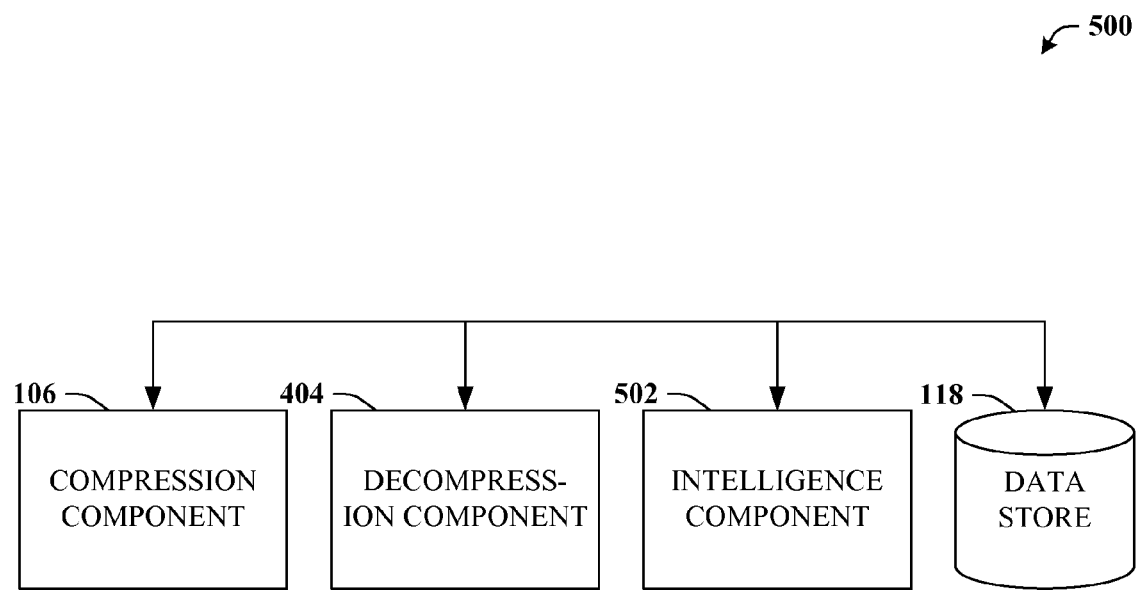
FIG. 5 illustrates a block diagram of a system that can provide or aid in various inferences.

Turning now to FIG. 5, system 500 that can provide or aid in various inferences is illustrated. Typically, system 500 can include compression component 106 that can compare received messages and increment a message count when application data 202 for the compared messages matches in order to facilitate creation of message pattern 116, as substantially described supra. Furthermore, system 500 can also include decompression component 404 that can extract application data from message pattern 116 and recreate non-application data for duplicate messages based upon information included in message pattern 116, also as detailed supra.

In addition, system 500 can also include intelligence component 502 that can provide for or aid in various inferences or determinations. It is to be appreciated that intelligence component 502 can be operatively coupled to all or some of the aforementioned components, e.g. 106 and 404. Additionally or alternatively, all or portions of intelligence component 502 can be included in one or more components described herein. Moreover, intelligence component 502 will typically have access to all or portions of data sets described herein, such as access to data store 118, and can furthermore utilize previously determined or inferred data.

For example, intelligence component 502 can aid compression component 106 or decompression component 404 by intelligently determining or inferring a set of alarm messages related to a lower-level device on a hierarchical network map. For example, when a message relating to a higher-level network device is received, it can be determined or inferred that a dependent lower-level network device will also be subject to failure conditions. Appropriate messages relating to the lower-level device can be generated even without receiving such messages either at the compression stage or decompression stage.

In accordance therewith, in order to provide for or aid in the numerous inferences described herein or otherwise suitable, intelligence component 502 can examine the entirety or a subset of the data available and can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data.

Such inference can result in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g. support vector machines, neural networks, expert systems, Bayesian belief networks, fuzzy logic, data fusion engines . . . ) can be employed in connection with performing automatic and/or inferred action in connection with the claimed subject matter.

A classifier can be a function that maps an input attribute vector, $x=(x1, x2, x3, x4, xn)$, to a confidence that the input belongs to a class, that is, $f(x)=confidence(class)$. Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, where the hypersurface attempts to split the triggering criteria from the non-triggering events. Intuitively, this makes the classification correct for testing data that is near, but not identical to training data. Other directed and undirected model classification approaches include, e.g. naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

FIGS. 6, 7, 8, and 9 illustrate various methodologies in accordance with the claimed subject matter. While, for purposes of simplicity of explanation, the methodologies are shown and described as a series of acts, it is to be understood and appreciated that the claimed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 6:
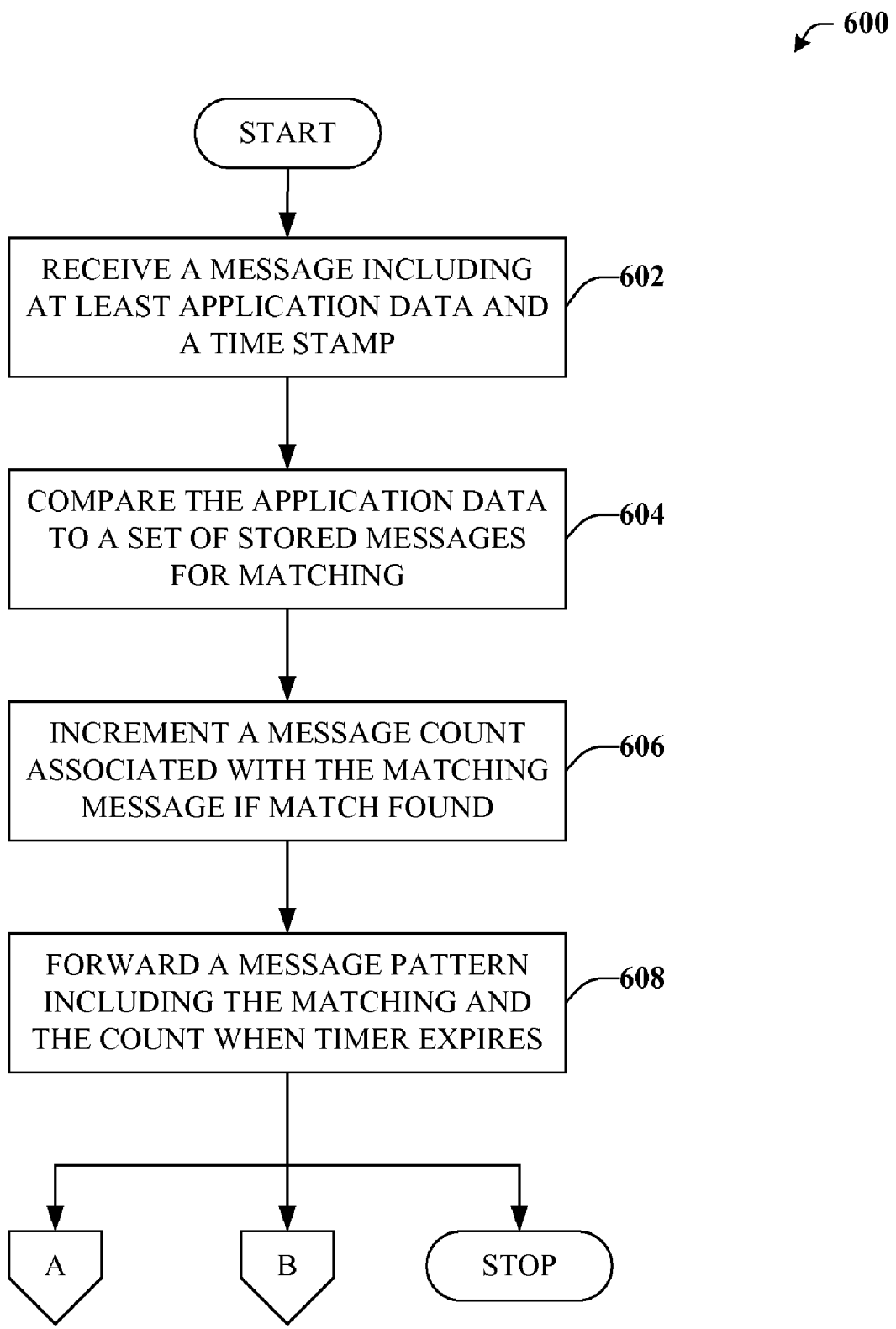
FIG. 6 depicts an exemplary flow chart of procedures that define a method for providing application-level compression of messages in a substantially lossless manner.

Turning now to FIG. 6, exemplary method 600 for providing application-level compression of messages in a substantially lossless manner is depicted. In general, at reference number 602, a message including at least application data and a time stamp can be received. As one example, the message can be in the form of a NMS alarm message from network resource indicating a fault condition is present or otherwise detected. The NMS alarm message can include the time stamp (or other non-application data) indicating when the messages was generated by the disparate network resource as well as a number of additional fields relating to the nature of the message and the identity of the resource transmitting the data. These additional fields typically constitute the application data. However, it should be appreciated that beyond NMS alarm messages, other messages or application-level data entities can be received with application data and non-application data defined differently.

At reference numeral 604, the application data included in the message can be compared to a set of stored messages for identifying a matching message. The stored messages can exist in one or more buffers, potentially having a unique buffer for each stored message. If a matching stored message is identified (e.g., the application data of the incoming message is equivalent to the application data for the matching stored message), then at reference numeral 606, a message count associated with the matching message can be incremented. At reference numeral 608, a message pattern including the matching message and the message count can be constructed and forwarded when a buffer timer expires. In particular, when the buffer timer for the matching stored message expires, the associated stored message can be forwarded, typically through a path subject to a potential resource bottleneck to a decompression system at the other edge of the potential resource bottleneck.

Figure 7:
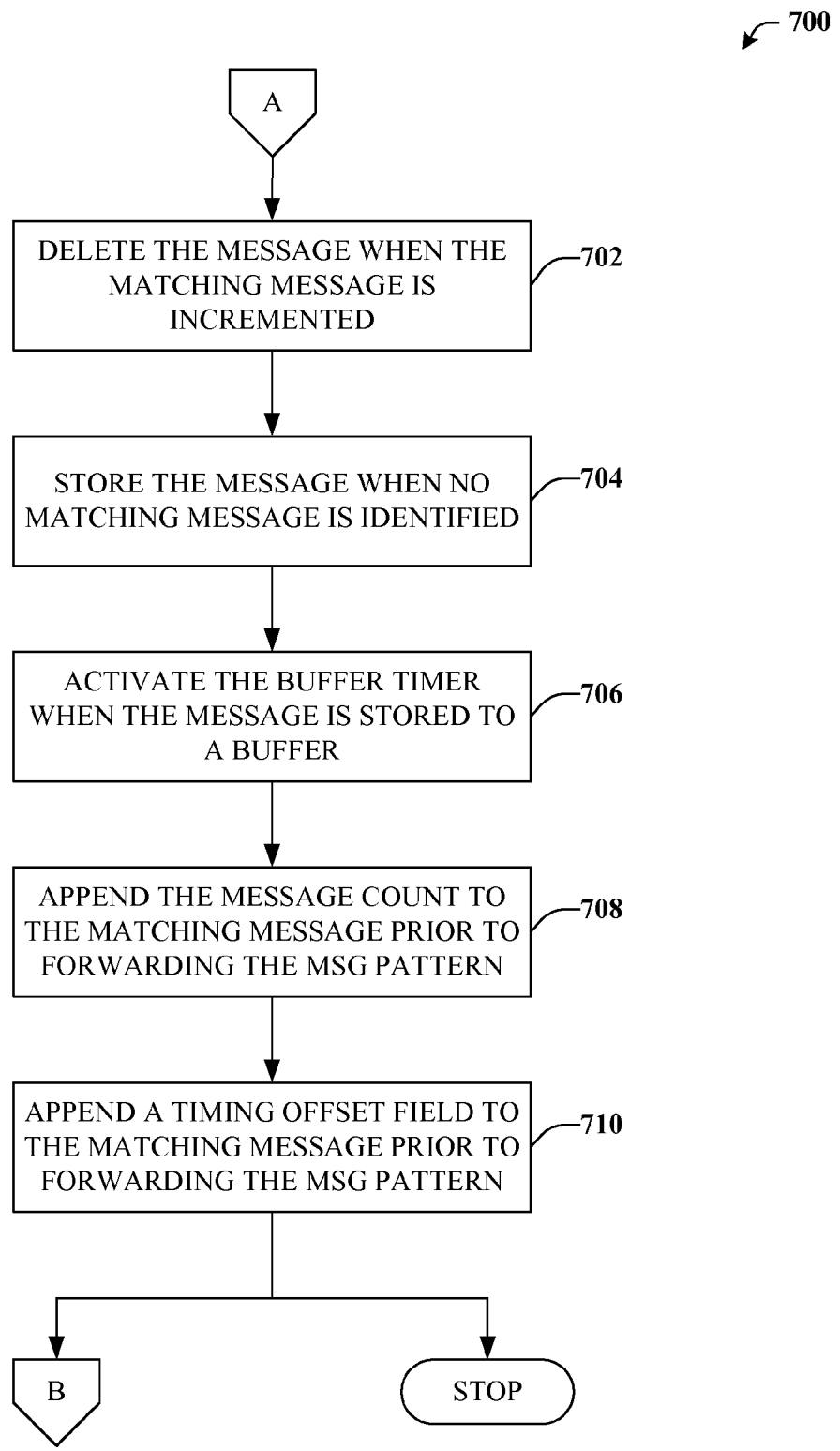
FIG. 7 illustrates an exemplary flow chart of procedures that define a method for providing additional features associated with application-level compression in a substantially lossless manner.

Turning now to FIG. 7, exemplary method 700 for providing additional features associated with application-level compression in a substantially lossless manner is illustrated. According to the diagram, at reference numeral 702, the incoming message received at reference numeral 602 can be deleted when the matching stored message is incremented (e.g., at reference numeral 606). Hence, once a matching message is identified and the associated message count incremented, then the received message can be simply discarded.

However, at reference numeral 704, when no matching message is identified, then the received message can be stored to the buffer. Once stored to the buffer, at reference numeral 706, the buffer timer discussed in connection with reference numeral 608 can be activated and/or initiated. In other words, if a match for the incoming message is found, then the message count for the matching message can be incremented and the incoming message disposed of. When no match is found, the incoming message is saved to the buffer with the buffer timer activated for the duration of the buffer period.

Next to be described, at reference numeral 708, the message count can be appended to the matching stored message prior to forwarding the message pattern (e.g., detailed at e.g. 608). Thus, updating the message count can entail updates to a particular data field included in the stored message. At reference numeral 710, one or more timing offset fields can be appended to the matching message prior to forwarding the message pattern. For example, the one or more timing offset fields can relate to the buffer period, a repeat time between related messages determined by the difference between time stamps, an end time that records a time stamp for the last message effectuating a message count increment prior to expiration of the buffer timer, or some other offset information.

Figure 8:
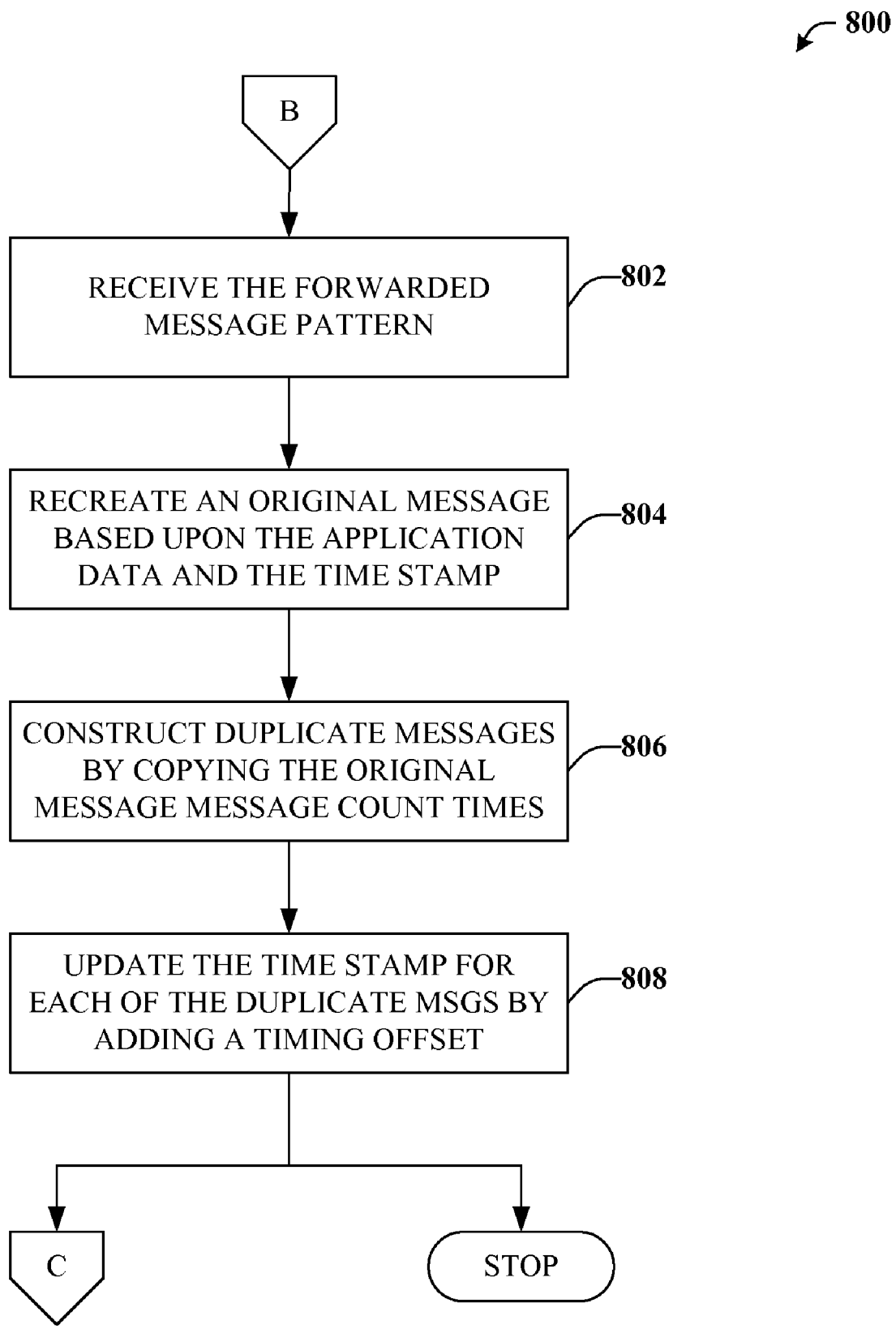
FIG. 8 is an exemplary flow chart of procedures that define a method for providing application-level decompression of messages in a substantially lossless manner.

With reference now FIG. 8, exemplary method 800 for providing application-level decompression of messages in a substantially lossless manner is provided. In accordance therewith, at reference numeral 802, the message pattern forwarded at reference numeral 608 can be received. Upon receipt of the message pattern, at reference numeral 804, an original message can be recreated based upon the application data and the time stamp extracted from the matching message included in the message pattern.

Given that it is known that application data included in the original message will be identical to all related messages discarded at reference numeral 702, thus, these messages can be reconstituted based upon information included in the message pattern. In particular, at reference numeral 806, duplicate messages can be constructed by copying the original message (or at least the application data portion of the original message) a particular number of times indicated by the message count. Thus, the message count included in the message pattern can indicate the number of duplicates to construct.

At this point, the duplicates will be identical to the original message, at least insofar as application data is concerned. However, non-application data must be recreated, in particular, the time stamp information associated with the messages deleted at reference numeral 702. Therefore, at reference numeral 808, the time stamp for each of the duplicate messages can be updated by adding a timing offset to a value of the time stamp of the original message. It should be appreciated that the timing offset can be derived from a known buffer period divided by the message count. Additionally or alternatively, the timing offset can be included in the message pattern as one or more fields, as discussed in connection with reference numeral 710 supra. For instance, the timing offset can be cumulatively added to each successive duplicate message.

Figure 9:
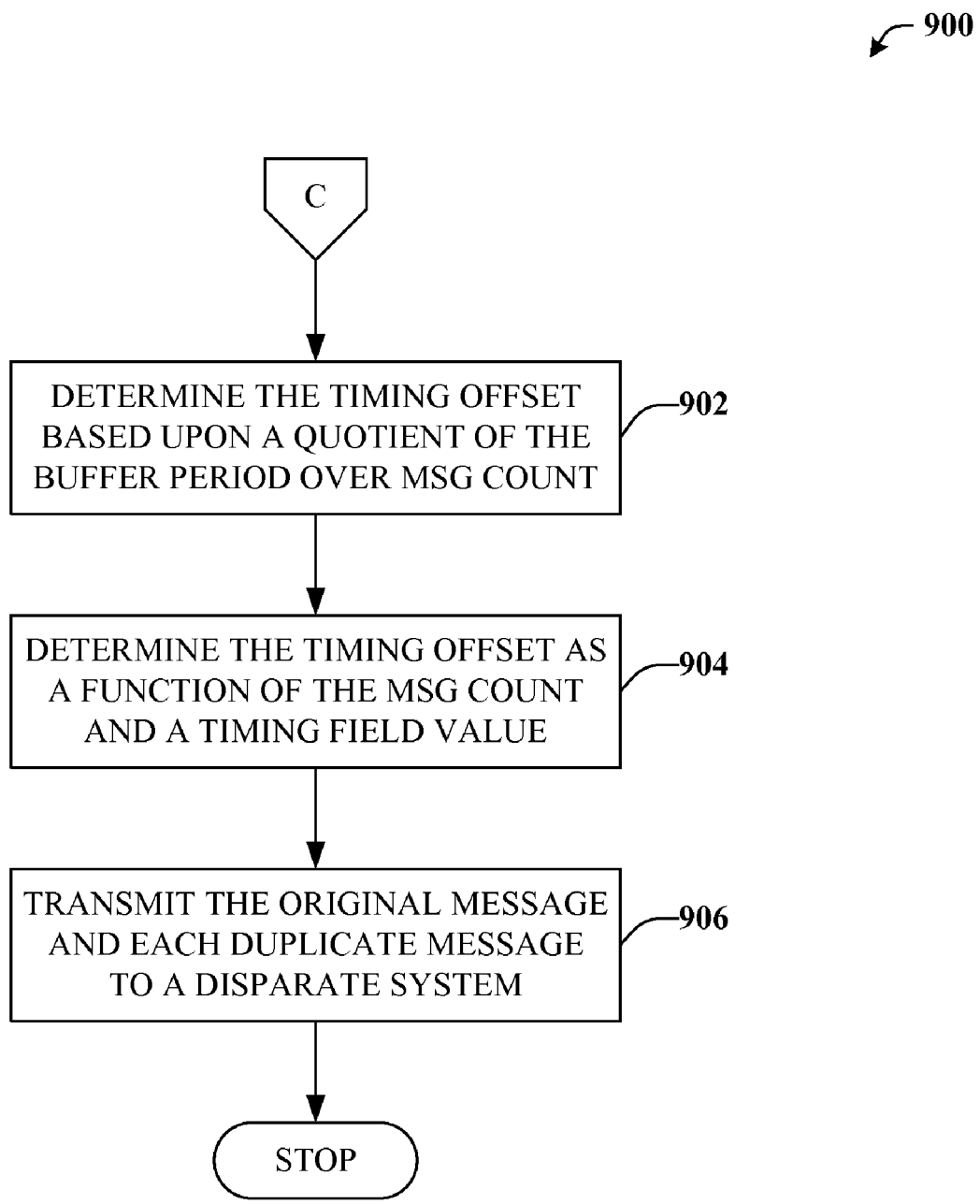
FIG. 9 depicts an exemplary flow chart of procedures defining a method for providing additional features associated with application-level decompression in a substantially lossless manner.

Turning now to FIG. 9, exemplary method 900 for providing additional features associated with application-level decompression in a substantially lossless manner is depicted. At reference numeral 902, the timing offset employed at reference numeral 808 is determined based upon a quotient of the buffer period over the message count. Similarly, at reference numeral 904, the timing offset is determined as a function of the message count and a value included in a data field of the matching message (or the message pattern), wherein the value relates to at least one of the buffer timer, a repeat interval, or a last message time, which was also introduced supra in connection with reference numeral 808. At reference numeral 906, the original message and each duplicate message constructed from the message pattern can be transmitted to a disparate system, such as an upstream analysis system.

Figure 10:
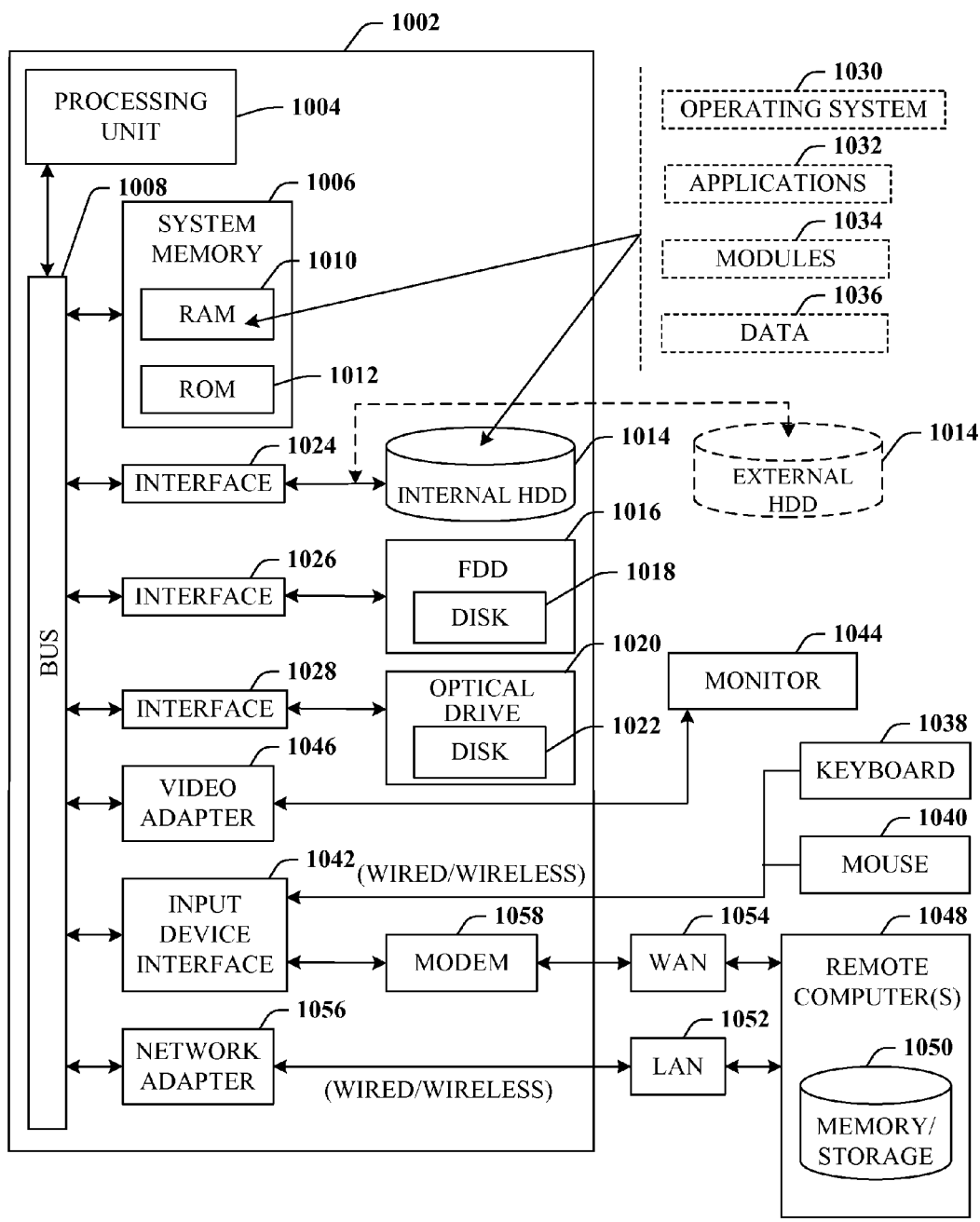
FIG. 10 illustrates a block diagram of a computer operable to execute the disclosed architecture.

Referring now to FIG. 10, there is illustrated a block diagram of an exemplary computer system operable to execute the disclosed architecture. In order to provide additional context for various aspects of the claimed subject matter, FIG. 10 and the following discussion are intended to provide a brief, general description of a suitable computing environment 1000 in which the various aspects of the claimed subject matter can be implemented. Additionally, while the claimed subject matter described above may be suitable for application in the general context of computer-executable instructions that may run on one or more computers, those skilled in the art will recognize that the claimed subject matter also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the claimed subject matter may also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media can include both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Continuing to reference FIG. 10, the exemplary environment 1000 for implementing various aspects of the claimed subject matter includes a computer 1002, the computer 1002 including a processing unit 1004, a system memory 1006 and a system bus 1008. The system bus 1008 couples to system components including, but not limited to, the system memory 1006 to the processing unit 1004. The processing unit 1004 can be any of various commercially available processors. Dual microprocessors and other multi-processor architectures may also be employed as the processing unit 1004.

The system bus 1008 can be any of several types of bus structure that may further interconnect to a memory bus (with or without a memory controller), a peripheral bus, and a local bus using any of a variety of commercially available bus architectures. The system memory 1006 includes read-only memory (ROM) 1010 and random access memory (RAM) 1012. A basic input/output system (BIOS) is stored in a non-volatile memory 1010 such as ROM, EPROM, EEPROM, which BIOS contains the basic routines that help to transfer information between elements within the computer 1002, such as during start-up. The RAM 1012 can also include a high-speed RAM such as static RAM for caching data.

The computer 1002 further includes an internal hard disk drive (HDD) 1014 (e.g., EIDE, SATA), which internal hard disk drive 1014 may also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE1394 interface technologies. Other external drive connection technologies are within contemplation of the subject matter claimed herein.

The drives and their associated computer-readable media provide nonvolatile storage of data, data structures, computer-executable instructions, and so forth. For the computer 1002, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the claimed subject matter.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is appreciated that the claimed subject matter can be implemented with various commercially available operating systems or combinations of operating systems.

A user can enter commands and information into the computer 1002 through one or more wired/wireless input devices, e.g. a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE1394 serial port, a game port, a USB port, an IR interface, etc.

A monitor 1044 or other type of display device is also connected to the system bus 1008 via an interface, such as a video adapter 1046. In addition to the monitor 1044, a computer typically includes other peripheral output devices (not shown), such as speakers, printers, etc.

The computer 1002 may operate in a networked environment using logical connections via wired and/or wireless communications to one or more remote computers, such as a remote computer(s) 1048. The remote computer(s) 1048 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1050 is illustrated. The logical connections depicted include wired/wireless connectivity to a local area network (LAN) 1052 and/or larger networks, e.g. a wide area network (WAN) 1054. Such LAN and WAN networking environments are commonplace in offices and companies, and facilitate enterprise-wide computer networks, such as intranets, all of which may connect to a global communications network, e.g. the Internet.

When used in a LAN networking environment, the computer 1002 is connected to the local network 1052 through a wired and/or wireless communication network interface or adapter 1056. The adapter 1056 may facilitate wired or wireless communication to the LAN 1052, which may also include a wireless access point disposed thereon for communicating with the wireless adapter 1056.

When used in a WAN networking environment, the computer 1002 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 via the serial port interface 1042. In a networked environment, program modules depicted relative to the computer 1002, or portions thereof, can be stored in the remote memory/storage device 1050. It will be appreciated that the network connections shown are exemplary and other means of establishing a communications link between the computers can be used.

The computer 1002 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g. computers, to send and receive data indoors and out; anywhere within the range of a base station. Wi-Fi networks use radio technologies called IEEE802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10 BaseT wired Ethernet networks used in many offices.

Figure 11:
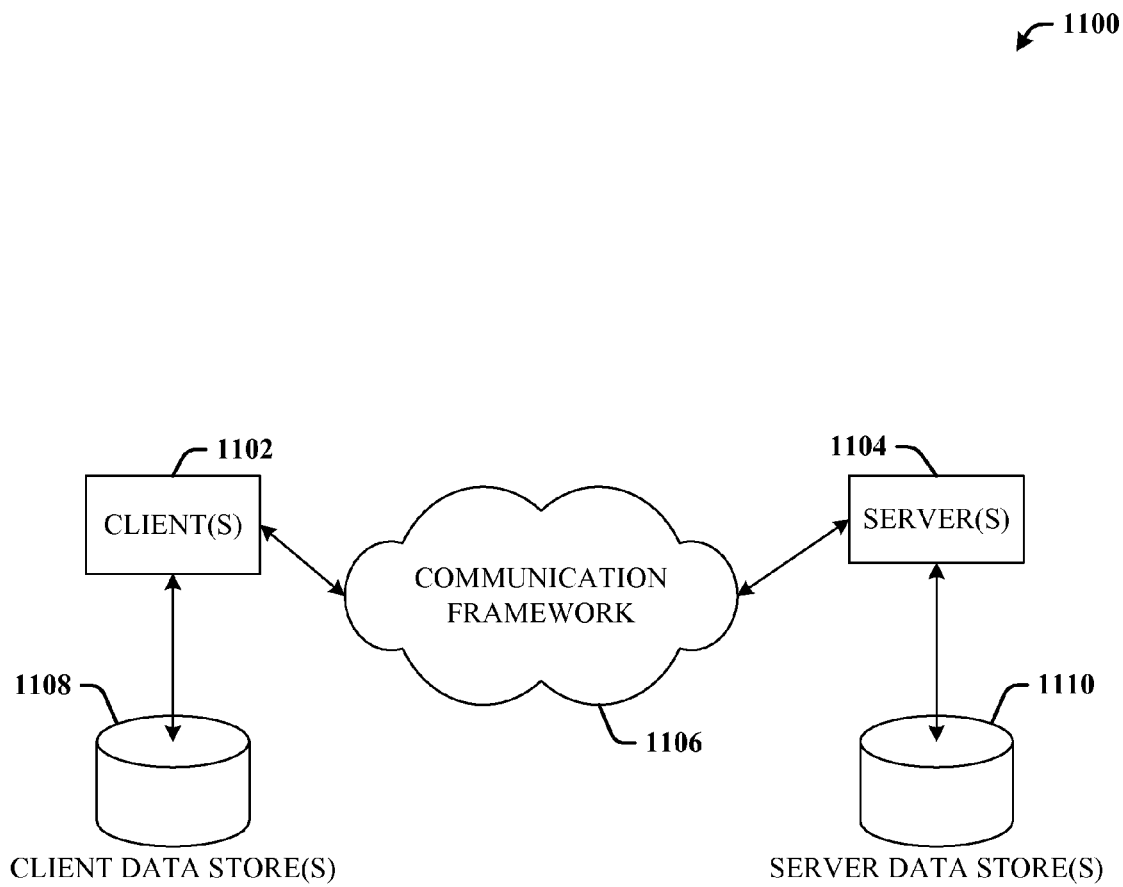
FIG. 11 illustrates a schematic block diagram of an exemplary computing environment.

Referring now to FIG. 11, there is illustrated a schematic block diagram of an exemplary computer compilation system operable to execute the disclosed architecture. The system 1100 includes one or more client(s) 1102. The client(s) 1102 can be hardware and/or software (e.g., threads, processes, computing devices). The client(s) 1102 can house cookie(s) and/or associated contextual information by employing the claimed subject matter, for example.

The system 1100 also includes one or more server(s) 1104. The server(s) 1104 can also be hardware and/or software (e.g., threads, processes, computing devices). The servers 1104 can house threads to perform transformations by employing the claimed subject matter, for example. One possible communication between a client 1102 and a server 1104 can be in the form of a data packet adapted to be transmitted between two or more computer processes. The data packet may include a cookie and/or associated contextual information, for example. The system 1100 includes a communication framework 1106 (e.g., a global communication network such as the Internet) that can be employed to facilitate communications between the client(s) 1102 and the server(s) 1104.

Communications can be facilitated via a wired (including optical fiber) and/or wireless technology. The client(s) 1102 are operatively connected to one or more client data store(s) 1108 that can be employed to store information local to the client(s) 1102 (e.g., cookie(s) and/or associated contextual information). Similarly, the server(s) 1104 are operatively connected to one or more server data store(s) 1110 that can be employed to store information local to the servers 1104.

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g. a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A system, comprising:
a reception component that receives a message that includes application data and a time stamp;
a compression component that examines stored messages included in a buffer and that increments a message count when the application data matches stored application data of a stored message, the compression component discards the message in response to the message count being incremented; and
a scheduler component that monitors a buffer timer associated with the message and that forwards a message pattern upon expiration of a buffer period, the message pattern includes at least the stored message and the message count.

2. The system of claim 1, wherein the message is a network monitoring system alarm message.

3. The system of claim 2, wherein the compression component compares the network monitoring system alarm message to a hierarchical network topology to identify a high-level resource failure.

4. The system of claim 3, wherein the compression component facilitates application-level compression by generation of an alarm message for a lower hierarchical network resource that is dependent upon the high-level resource.

5. The system of claim 1, wherein the compression component stores the message to the buffer in response to application data for the message not matching the stored application data.

6. The system of claim 5, wherein the scheduler component initiates the buffer timer in response to the compression component storing the message to the buffer.

7. The system of claim 1, wherein the compression component appends a count field to the stored message and populates the count field with the message count.

8. The system of claim 1, wherein the compression component appends a buffer time field to the stored message and populates the buffer time field with the buffer period.

9. The system of claim 1, wherein the compression component appends a repeat time field to the stored message and populates the repeat time field with a time value that represents a duplicate message interval determined by subtracting a stored time stamp of a stored message in the buffer from the time stamp of the message.

10. The system of claim 1, wherein the compression component appends an end time field to the stored message and populates the end time field with a last message time stamp included in a last message, and wherein the last message represents a final duplicate message received prior to expiration of the buffer period.

11. The system of claim 4, wherein the application-level compression is characterized by a reduction in a number of messages that traverse a network resource.

12. A system, comprising:
a receiving component configured to receive a message pattern that includes a message and a message count; and
a decompression component configured to extract application data and a time stamp from the message pattern to produce an original message, wherein the decompression component is further configured to copy the application data of the original message to a number, derived from the message count, of duplicate messages, populate a time stamp field for at least one duplicate message with a value, wherein the value is determined based upon cumulative addition of a timing offset to the time stamp of the original message, and determine the timing offset based upon a buffer period divided by the message count.

13. The system of claim 12, wherein the decompression component is further configured to determine the timing offset as a function of the message count and a value included in one or more data field of the message pattern, wherein the one or more data field includes a buffer time field.

14. The system of claim 12, further comprising a transmission component configured to propagate the original message and duplicate messages to a disparate system.

15. The system of claim 12, wherein the decompression component is further configured to determine the timing offset as a function of the message count and a value included in one or more data field of the message pattern, wherein the one or more data field includes a repeat time field.

16. A method, comprising:
receiving a message including at least application data and a time stamp;
comparing the application data to a set of stored messages for identifying a matching message;
incrementing a message count associated with the matching message when a matching message is identified;
forwarding a message pattern including the matching message and the message count when a buffer timer expires; and
appending the message count to the matching message prior to forwarding the message pattern.

17. The method of claim 16, further comprising receiving the message in the form of a network monitoring system alert message from network equipment when a predefined failure condition is detected.

18. The method of claim 16, further comprising
storing the message to a buffer when no matching message is identified; and
activating the buffer timer when the message is stored to the buffer.

19. The method of claim 16, further comprising at least one of:
receiving the forwarded message pattern;
recreating an original message based upon the application data and the time stamp extracted from the matching message included in the message pattern;
constructing duplicate messages by copying the original message a number of times indicated by the message count; and
updating the time stamp for each of the duplicate messages by adding a timing offset to a value for the time stamp.

20. The method of claim 18, further comprising at least one of:
determining the timing offset based upon a quotient of the buffer period over the message count;
determining the timing offset as a function of the message count and a value included in a data field of the matching message, the value relating to at least one of the buffer timer, a repeat interval, or a last message time; and
transmitting the original message and at least one duplicate message to a disparate system.

* * * * *